(12) United States Patent
Lee et al.

(10) Patent No.: US 11,262,391 B1
(45) Date of Patent: *Mar. 1, 2022

(54) POWER OUTAGE DETECTION (71) Applicant: CSC Holdings, LLC, Bethpage, NY (US)

(72) Inventors: Robert G. Lee, Mastic Beach, NY (US); John Nicastro, St. James, NY (US); Pragash Pillai, Centerport, NY (US); Brian Daniels, Commack, NY (US)

(73) Assignee: CSC Holdings, LLC, Bethpage, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/811,110

(22) Filed: Mar. 6, 2020

Related U.S. Application Data (63) Continuation of application No. 14/879,570, filed on Oct. 9, 2015, now Pat. No. 10,585,124.

(60) Provisional application No. 62/163,864, filed on May 19, 2015.

(51) Int. Cl.
*H04L 12/26* (2006.01)
*G01R 21/133* (2006.01)
*H04L 43/16* (2022.01)

(52) U.S. Cl.
CPC ............ *G01R 21/133* (2013.01); *H04L 43/16* (2013.01)

(58) Field of Classification Search
CPC ....................................................... G01D 4/004
USPC ..................................................... 340/870.02
See application file for complete search history.

(56) References Cited

U.S. PATENT DOCUMENTS

| | | | |
|---|---|---|---|
| 5,742,715 A * | 4/1998 | Boehlke ................. | G01M 11/35 250/227.15 |
| 7,502,841 B2 | 3/2009 | Small et al. | |
| 7,869,369 B2 | 1/2011 | Overcash | |
| 8,478,309 B1 | 7/2013 | Davis, III et al. | |
| 8,601,523 B2 | 12/2013 | Sellers et al. | |
| 9,027,070 B2 | 5/2015 | Sellers et al. | |
| 9,544,625 B2 | 1/2017 | Sellers et al. | |
| 10,585,124 B1 * | 3/2020 | Lee ....................... | H04L 41/065 |
| 2003/0145075 A1 | 7/2003 | Weaver et al. | |
| 2003/0229650 A1 | 12/2003 | Olstad et al. | |
| 2007/0047449 A1 | 3/2007 | Berger et al. | |
| 2008/0039203 A1 | 2/2008 | Ackley et al. | |
| 2008/0126540 A1 | 5/2008 | Zeng et al. | |
| 2009/0222687 A1 | 9/2009 | Baker | |
| 2009/0261805 A1 * | 10/2009 | Shuey .................. | G01R 21/133 324/76.11 |
| 2009/0300773 A1 | 12/2009 | Pal | |
| 2010/0246421 A1 | 9/2010 | Marshall | |

(Continued)

*Primary Examiner* — Min Huang
(74) *Attorney, Agent, or Firm* — Sterne, Kessler, Goldstein & Fox P.L.L.C.

(57) ABSTRACT

Methods and systems to detect power outage are provided herein. The system includes a Cable Modem Termination System (CMTS) to periodically poll cable modems and determine cable modems of the plurality of cable modems that are offline based on the poll. The system correlates and aggregates locations of the cable modems that are offline to determine a geographic area where a percentage of the cable modems that are offline is higher than a predetermined threshold. A report is generated indicating a power outage in the geographic area when the percentage is above the predetermined threshold.

20 Claims, 6 Drawing Sheets

(56) References Cited

U.S. PATENT DOCUMENTS

| | | | |
|---|---|---|---|
| 2010/0256866 A1* | 10/2010 | Toda | F02P 19/027 |
| | | | 701/29.2 |
| 2010/0322214 A1 | 12/2010 | Workman et al. | |
| 2011/0007662 A1 | 1/2011 | Zisapel et al. | |
| 2011/0218686 A1* | 9/2011 | McHann, Jr | H02J 13/0086 |
| | | | 700/286 |
| 2012/0047545 A1* | 2/2012 | Sellers | H04N 21/24 |
| | | | 725/111 |
| 2014/0074670 A1 | 3/2014 | Garrity et al. | |
| 2014/0082650 A1 | 3/2014 | Sellers et al. | |
| 2015/0237385 A1 | 8/2015 | Sellers et al. | |
| 2015/0264051 A1 | 9/2015 | Hoggan | |
| 2016/0179849 A1* | 6/2016 | Dubois | G06F 16/211 |
| | | | 707/803 |
| 2016/0182407 A1 | 6/2016 | McCaughan et al. | |

\* cited by examiner

FIG. 1

| ACCT # | BILLING ADDRESS | MAC ADDRESS | Assigned Port |
|---|---|---|---|
| 192 | 100 Smith St. | A | 110a |
| 192 | 100 Smith St. | B | 110a |
| 192 | 100 Smith St. | C | 110f |
| 193 | 210 Main St. | D | 110a |
| 194 | 315 F St. | E | 110g |
| 194 | 315 F St. | F | 110g |
| 195 | 90 Main Ave. | G | 110f |
| ... | ... | ... | ... |

200

| City | Street | No. of offline Cable modems | Regional Name | Area Name | Local Area Name | Minimum Latitude | Minimum Longitude | Maximum Latitude | Maximum Longitude |
|---|---|---|---|---|---|---|---|---|---|
| Brooklyn | 86th Street | 4 | CWN | New York City | Brooklyn | 40.592 | -74.009 | 40.635 | -73.906 |
| Brooklyn | 27th Street | 4 | CWN | New York City | Brooklyn | 40.59 | -73.95 | 40.629 | -73.942 |
| Edison | Fox Road | 3 | New Jersey | New Jersey South | Raritan valley | 40.495 | -74.414 | 40.497 | -74.412 |
| Brooklyn | Lewis Avenue | 3 | CWN | New York City | Brooklyn | 40.685 | -73.936 | 40.689 | -73.935 |

POWER OUTAGE DETECTION

CROSS-REFERENCE TO RELATED APPLICATION

This application is a continuation of U.S. application Ser. No. 14/879,570, filed Oct. 9, 2015, now U.S. Pat. No. 10,585,124, which claims the benefit of U.S. Provisional Application No. 62/163,864, filed May 19, 2015, each of which is incorporated herein by reference in its entirety.

BACKGROUND OF THE INVENTION

Field of the Invention

The present invention generally relates to power outage detection.

Background Art

Power companies typically depend on phone calls from customers to determine whether there is a power outage in a given area. Power companies currently do not have information to quickly and accurately detect the extent of a power outage based solely on phone calls reporting a power outage. Methods and systems are needed to overcome this deficiency.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings.

The present invention will now be described with reference to the accompanying drawings. In the drawings, like reference numbers may indicate identical or functionally similar elements.

DETAILED DESCRIPTION OF THE INVENTION

Methods and systems for detecting power outage are described herein. In particular, methods and systems for detecting power outage using cable modems is described. According to an embodiment of the invention, cable modems in a network are periodically polled to determine whether they are offline. Locations of offline cable modems are correlated and aggregated to determine a geographic area that is experiencing a power outage. The examples described herein are directed towards determining a power outage based on offline cable modems or digital set top boxes. However, it is to be appreciated that the embodiments presented herein may also be used to detect power outage based on polling of other electronic devices in any type of network.

Embodiments are described that incorporate features of the invention. The described embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1:
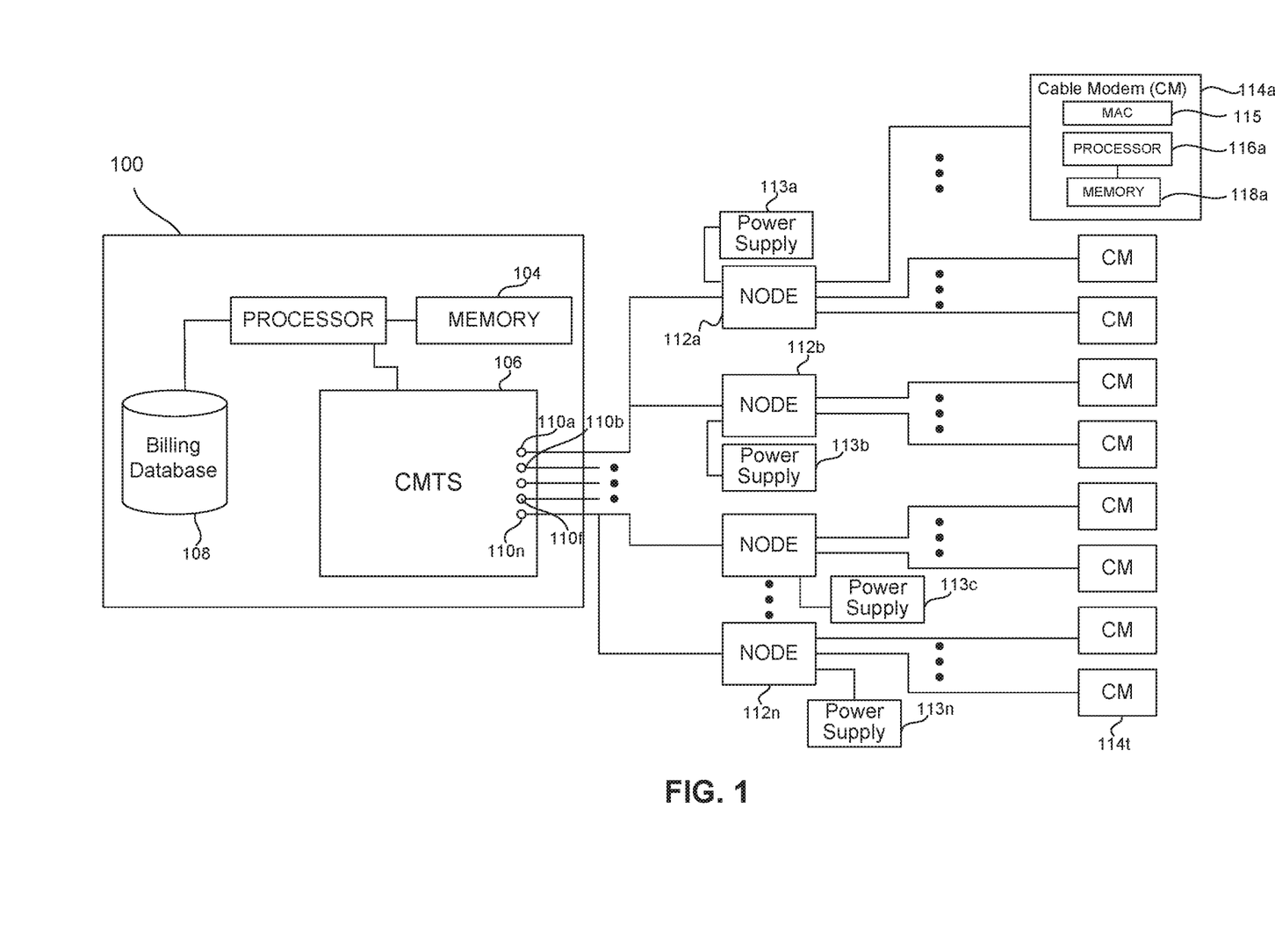
FIG. 1 illustrates an example Power Outage Detection System (PODS) according to an embodiment of the disclosure.

FIG. 1 illustrates an example Power Outage Detection System (PODS) 100 according to an embodiment of the invention. PODS 100 is coupled to one or more nodes 112a-m. Each of nodes 112a-m is coupled to one or more cable modems 114a-t. PODS 100 includes a processor 102 coupled to a memory 104, a cable modem termination system (CMTS) 106, and billing database 108. CMTS 106 includes a plurality of ports 110a-n. Ports 110a-n are physical hardware communication ports, that are typically part of a network card (not shown) installed inside the CMTS 106. Each of ports 110 is coupled to one or more nodes 112a-n. A port 110 may be coupled to multiple nodes 112, however each node 112 is coupled to only one port 110. Each node 112 may be coupled to multiple cable modems 114, however each cable modem 114 can only be coupled to a single node 112 at a time. A "network" as described herein refers to the nodes 112 and cable modems 114 that are coupled to that CMTS 106 via ports 110. The network may be a hybrid network. The hybrid network may include the Internet and other networks such as Data Over Cable Service Interface Specification (DOCSIS) networks. It is to be appreciated that embodiments presented herein are applicable to any type of network where devices are in communication with each other.

Nodes 112 receive downstream optical signals from CMTS 106 via fiber optic cables (not shown) and convert the optical signals into electrical signals that are transmitted to cable modems 114. Similarly, nodes 112 may receive upstream electrical signals from cable modems 114 and convert them to optical signals that are transmitted to CMTS 106 via the fiber optic cables and ports 110. Power supplies 113a-n are respectively coupled to nodes 112a-n. In an example, a single power supply 113 may service one or more nodes 112a-n. Each cable modem 114 may include a processor 116 coupled to a memory 118. Each cable modem 114 also includes a media access controller (MAC) 115. The embodiments presented herein are described with respect to cable modems 114. However, it is to be appreciated that these embodiments are applicable to set top boxes as well.

In an embodiment, cable modem termination system 106 periodically polls cable modems 114a-t. The poll may be in the form of a periodic ranging (RNG) request or a periodic Simple Network Management Protocol (SNMP) query sent to each cable modem 114. If no response is received to the RNG request or SNMP query, then the cable modem 114 may be deemed to be "offline" or "powered down." In an example, processor 102 is able to determine whether a cable modem 114 is powered down based on whether a MAC 115 of the cable modem is offline. For example, processor 102 determines whether a MAC 115 of a cable modem 114 is offline based on whether a response is received for a poll sent by CMTS 106.

Figure 2:
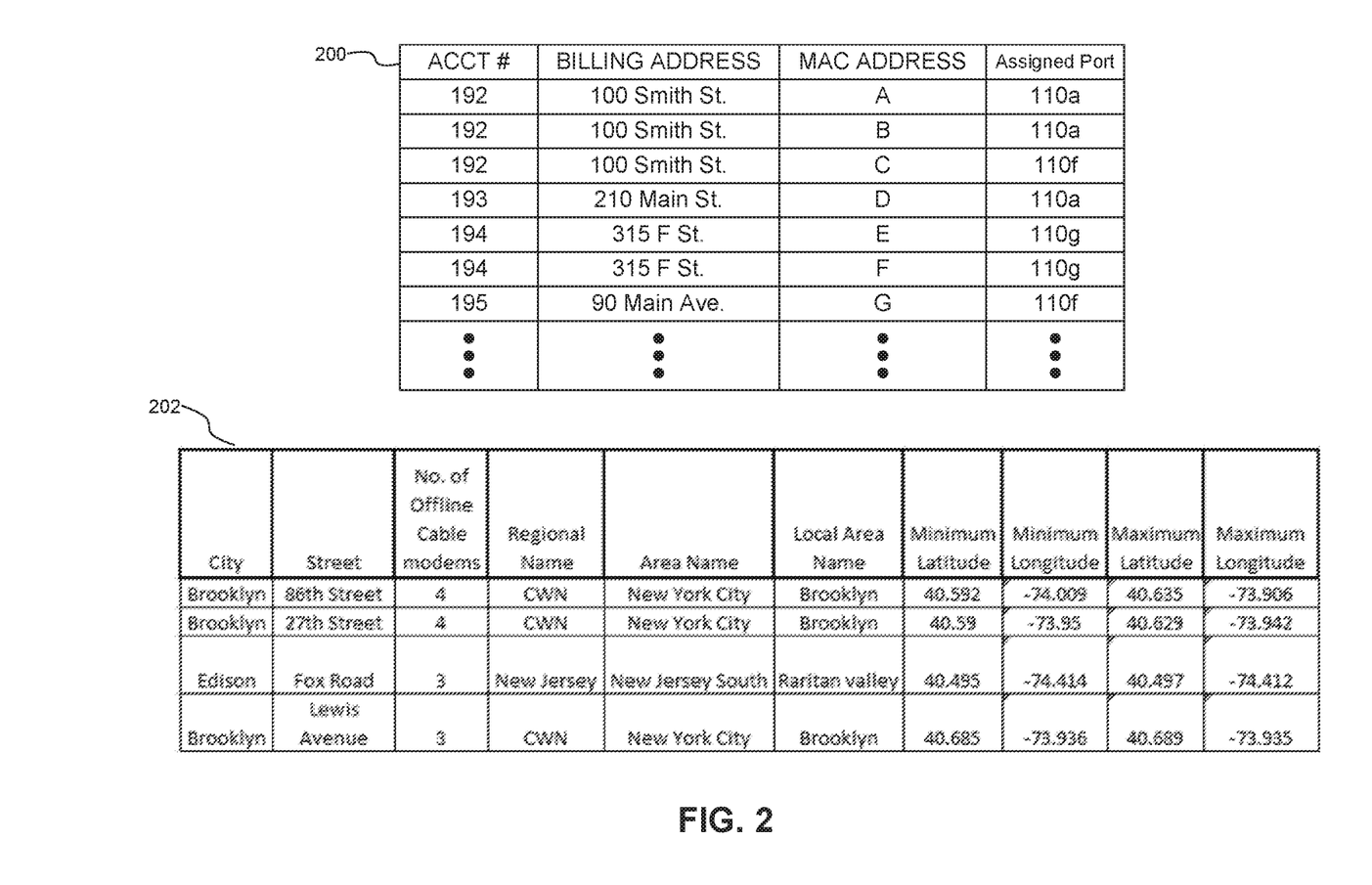
FIG. 2 illustrates example data structures according to an embodiment of the disclosure.

Processor 102 may determine the geographic location, such as the street address or latitude and longitude, of the offline cable modem 114 based on one or more of data in billing database 108, a port 110 assigned to the offline cable modem 114, or MAC address associated with the offline cable modem 114. FIG. 2 illustrates an example table 200 of data stored in billing database 108. Table 200 includes a customer account number, associated billing address, MAC address for the cable modem, and a port that the cable modem is assigned to report in on. If a cable modem 114 fails to report in on its assigned port, processor 102 can determine the cable modem's corresponding billing address based on its MAC address in table 200. In addition, billing database 108 may include geolocation data for the cable modems 114. Geolocation is the identification of the geographic location of an object, such as cable modems 114, a radar source, mobile phone, or any Internet-connected computer terminal. Geolocation may refer to the practice of assessing the location, or to the actual assessed location. The geolocation data can be used to compute a latitude and longitude of each offline cable modem 114.

Processor 102 determines whether a specific geographic area has a concentration of cable modems 114 that are offline by correlating and aggregating locations of offline cable modems 114. The aggregated information may be compiled into table 202 shown in FIG. 2. Table 202 includes the number of cable modems that are offline for a particular city, street, region, area, and local area. Table 202 also includes the minimum latitude, minimum longitude, maximum latitude and maximum longitude of the correlated and aggregated offline cable modems 114.

Processor 102 determines whether a percentage of the cable modems 114 that are offline for a geographic area is higher than a predetermined threshold. If the percentage is above the predetermined threshold, then the geographic area may be deemed to be experiencing a power outage. For example, the predetermined threshold may be 80%. Thus, if more than 80% of cable modems for a particular street, block, neighborhood, local area, or city are offline, then processor 102 may indicate that geographic area as experiencing a power outage. Examples of power outage detection are described further below with respect to FIGS. 3 and 4.

Figure 3A:
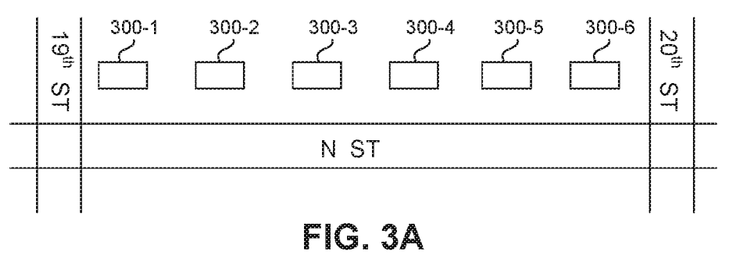
FIGS. 3A-3C illustrate a graphical representation of power outage detection according to an embodiment of the disclosure.
Figure 3B:
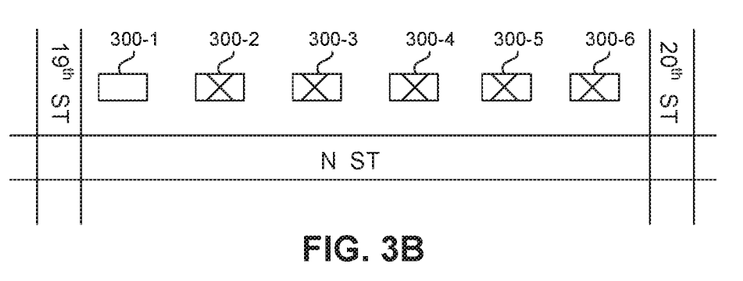
Figure 3C:
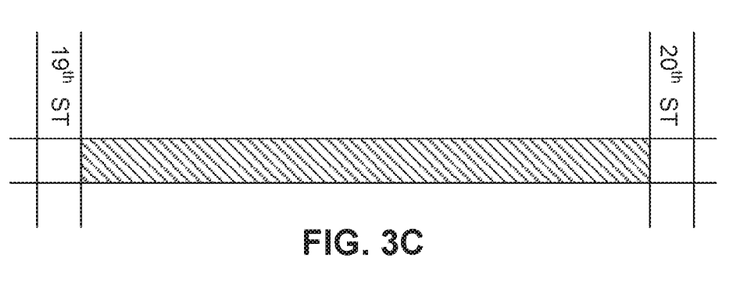

FIGS. 3A-3C illustrate a graphical representation of power outage detection according to an embodiment of the disclosure. FIG. 3A illustrates a graphical view of houses 300-1 through 300-6 on N street NW that are bound between $19^{th}$ street NW and $20^{th}$ street NW. Houses that have their cable modems offline are marked with an X. In the example in FIG. 3A, based on a poll by CMTS 106, none of the houses 300-1 through 300-6 have their respective cable modems 114 offline thereby indicating there is no power outage.

FIG. 3B illustrates an example where upon polling the cable modems in houses 300-2-6 are found to be offline. Houses 300-2-6 are presumed to have a power outage and are marked with an X. Processor 102 determines locations of houses 300-2-6 based on the method described above. The locations might include the street address and/or the latitude and longitude of each house. The data for the houses with the offline cable modems may be compiled into a table as in table 202. By correlating and aggregating the locations of houses 300-2 through 300-6, processor 102 can determine which geographical area is experiencing a power outage. In this example, N street bound between $19^{th}$ street and $20^{th}$ street is experiencing the power outage.

In the example in FIG. 3B, house 300-1 might not be experiencing a power outage because a separate power tower from houses 300-2-6 may service it. It is also possible that a different cable service provider services house 300-1 with a cable modem that cannot be polled by the service provider operating CMTS 106. Thus, while house 300-1 might also be experiencing a power outage, it will not show up in the poll by CMTS 106. However, in the example in FIG. 3B, since 5 out of 6 (83%) of cable modems on N street NW are offline, and if the predetermined threshold is 80%, then the presumption is that there is a power outage on N street even if polling data for house 300-1 is unavailable or if a poll indicates that a cable modem in house 300-1 is online.

In the example in FIG. 3B, the houses in 300-2 through 300-6 could have their cable modems offline because a power supply 113 coupled to a node 112 servicing cable modems 114 in houses 300-2-6 is malfunctioning instead of an actual power outage. Thus, it may be the node 112 that is experiencing the power outage instead of houses 300-2-6. It is also possible that a node 112 coupled to cable modems 114 in houses 300-2-6 is malfunctioning and is unable to respond to a poll from CMTS 106. In a further example, a fiber optic cable coupling nodes 112 to CMTS 106 may be malfunctioning resulting in cable modems 114 being unresponsive to a poll by CMTS 106. In yet another example, houses 300-2-6 may be vacation homes and their owners may have powered down their cable modems 114 to conserve energy while they are away resulting in no response from the cable modems 114 in houses 300-2-6. Thus, there may be multiple reasons that cable modems in houses 300-2-6 are offline other than that they are experiencing a power outage.

To determine whether there is a genuine power outage in houses 300-2-6, processor 102 may correlate phone calls logged in a database that report a power outage in one or more of houses 300-2-6 to the polling data indicating that the cable modems in houses 300-2-6 are offline. Correlating the occurrence of calls from one or more of houses 300-2-6 to the data indicating that the cable modems 114 are offline in houses 300-2-6 confirms the power outage as opposed to a malfunctioning power supply 113 or node 112, or a damaged fiber optic cable.

In an example, a power supply 113 may be used to confirm power outage in a given geographical area. For example, a power supply 113 coupled to a node 112 may send data to CMTS 106 that indicates the node 112 is experiencing a power failure rather than the cable modems 114 serviced by that node. In a further example, data from a node 112 may be used to confirm power outage in a given geographical area. For example, a node 112 may send data to CMTS 106 to indicate that one of the fiber optic cable coupling the node 112 to CMTS 106 is experiencing failure rather than the cable modems 114 coupled to the node 112.

In a further example, processor 102 determines whether there is a power outage based on a time of day when the percentage of offline cable modems above the predetermined threshold is detected for a particular geographic area. For example, some owners of cable modems 114 might power down their devices at night to conserve energy. Thus, if the power outage is detected at night, other factors such as phone calls reporting the power outage may be used by processor 102 to confirm the power outage.

In another example, no correlation of calls reporting power outage, data from power supplies 113 or nodes 112 with polling data may be used to confirm the power outage with the assumption that if a certain percentage of cable modems in a geographic area are offline, then their respective houses are experiencing a power outage.

In an example, processor 102 may detect whether cable modems that were offline are back online based on polling and generate a report indicating the cable modems that power is restored for the geographic area.

FIG. 3C illustrates an example graphical representation that might be sent in a report to a power company indicating power outage. In this example, data on which houses are experiencing a power outage is removed before sending the report to the power company. The data excluded may be the number and locations of cable modems that are offline and the names and addresses of the owners of the offline cable modems. This is to maintain confidentiality of the cable company's subscriber base and to maintain privacy for individuals who are experiencing the power outage. In another example, the graphical representation shown in FIG. 3B is sent to the power company, where each of the houses 300-2-6 which is experiencing a power outage is indicated along with an address of the houses 300-2-6 experiencing the power outage. It is to be appreciated that the amount of data provided on the power outage is a design choice and may be arbitrary.

In an example, the report is not graphical as in FIGS. 3A-C but in a form of data that indicates a number of cable modems that are offline for one or more of a city, street, region, area, minimum and maximum latitude, and minimum and maximum longitude as shown in table 202. It is to be appreciated that both graphical and data based reports may be provided.

Figure 4:
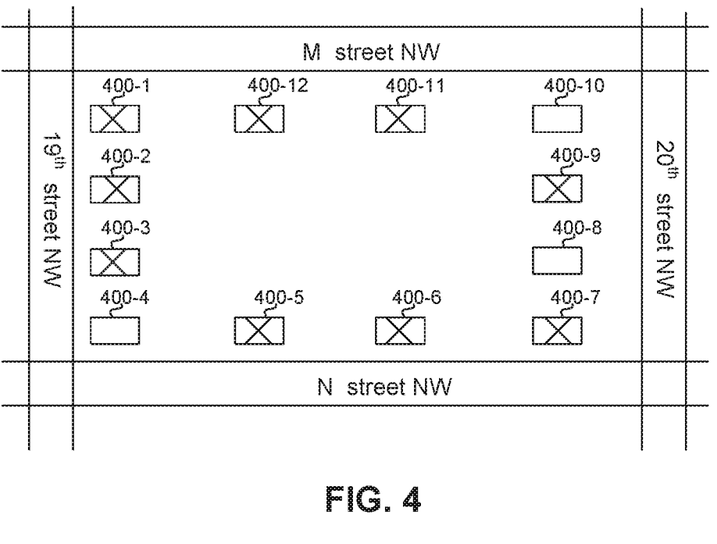
FIG. 4 illustrates another example of a graphical representation of power outage detection according to an embodiment of the disclosure.

FIG. 4 illustrates another example of a graphical representation of a power outage according to an embodiment of the disclosure. The example in FIG. 4 illustrates houses 400-1 through 400-12 that are between $19^{th}$ and $20^{th}$ streets NW and are bound by M street NW and N street NW. In the example in FIG. 4, houses 400-1-3, houses 400-5-7, and houses 400-9-10 have offline cable modems indicating a possible power outage. These houses have been marked with an X. Houses 400-8 and 400-10 might not be using the same cable service provider that is conducting the poll or are being serviced by a different power source and are not indicated as being offline.

To determine the geographic area in this example, the system might determine the latitude and longitude or street address of houses 400-1, 400-7, 400-9, and 400-5 based on table 200. The locations of of these houses may be represented by a minimum latitude, minimum longitude, maximum latitude, and maximum longitude that forms a geographic area experiencing power outage. By having at least four endpoint locations of offline cable modems, processor 102 is able to determine the geographic area which happens to be between $19^{th}$ and $20^{th}$ streets NW bound by M and N streets NW. Thus, processor 102 can determine a power outage in an area of any size by looking at location data for the endpoint locations of offline cable modems.

Figure 5:
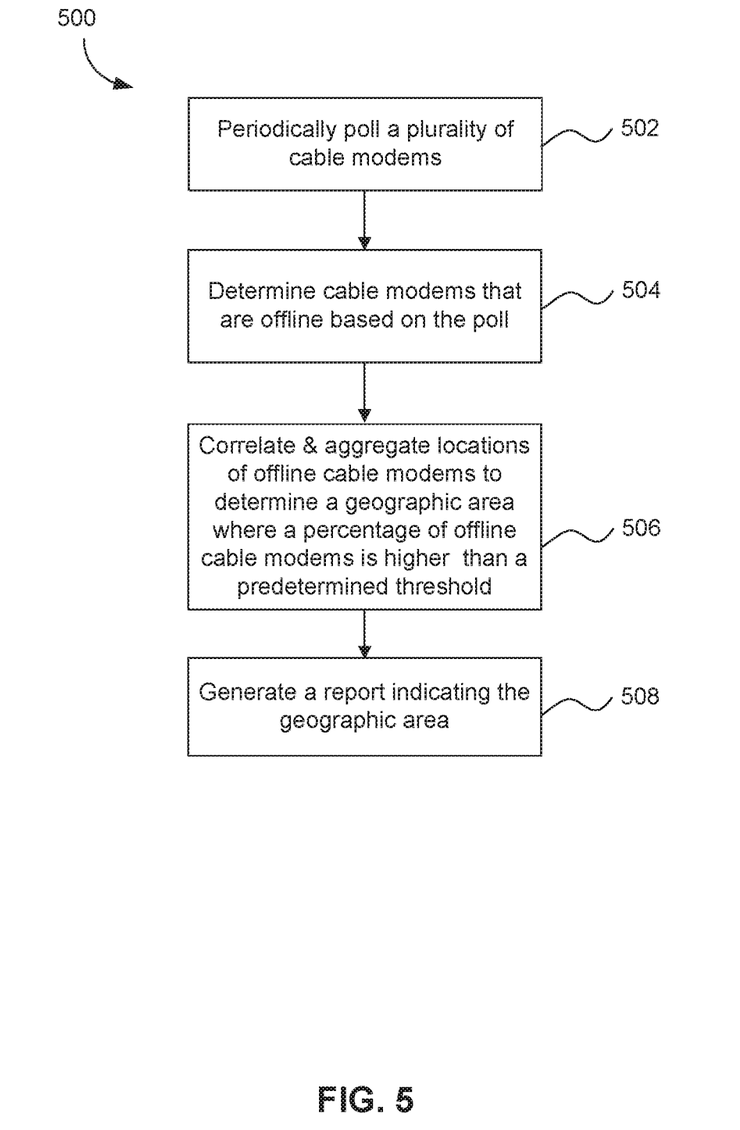
FIG. 5 illustrates an example flowchart to detect power outage according to an embodiment of the disclosure.

FIG. 5 illustrates an example flowchart 500 to detect power outage according to an embodiment of the disclosure. Flowchart 500 will be described with continued reference to the example operating environment depicted in FIGS. 1-4. However, the process is not limited to these embodiments.

Note that some steps shown in flowchart 500 do not necessarily have to occur in the order shown. In an example, the steps in flowchart 500 are performed by processor 102 and/or CMTS 106 based on instructions stored in memory 104.

In step 502, a periodic poll of cable modems is conducted. For example, CMTS 106 periodically conducts a poll of cable modems 114a-114t.

In step 504, it is determined whether cable modems are offline based on the poll. For example, CMTS 106 determines which cable modems 114a-114t are offline based on the poll conducted in step 502.

In step 506, locations of offline cable modems are correlated and aggregated to determine a geographic area where a percentage of the offline cable modems is higher than a predetermined threshold. For example, processor 102 based on the poll conducted by CMTS 106, correlates and aggregates locations of offline cable modems 114 to determine the geographic area where the percentage of offline cable modems is higher than a predetermined threshold. The predetermined threshold may be, for example, 80%.

In step 508, a report is generated indicating the geographic area experiencing the power outage. For example, processor 102, based on instructions stored in memory 104, generates either a data report or a graphical report that indicates the geographic area that is experiencing the power outage.

The representative functions described herein can be implemented in hardware, software, or some combination thereof. For instance, the representative functions can be implemented using computer processors, computer logic, application specific circuits (ASIC), digital signal processors, etc., as will be understood by those skilled in the arts based on the discussion given herein. Accordingly, any processor that performs the functions described herein is within the scope and spirit of the embodiments presented herein.

Figure 6:
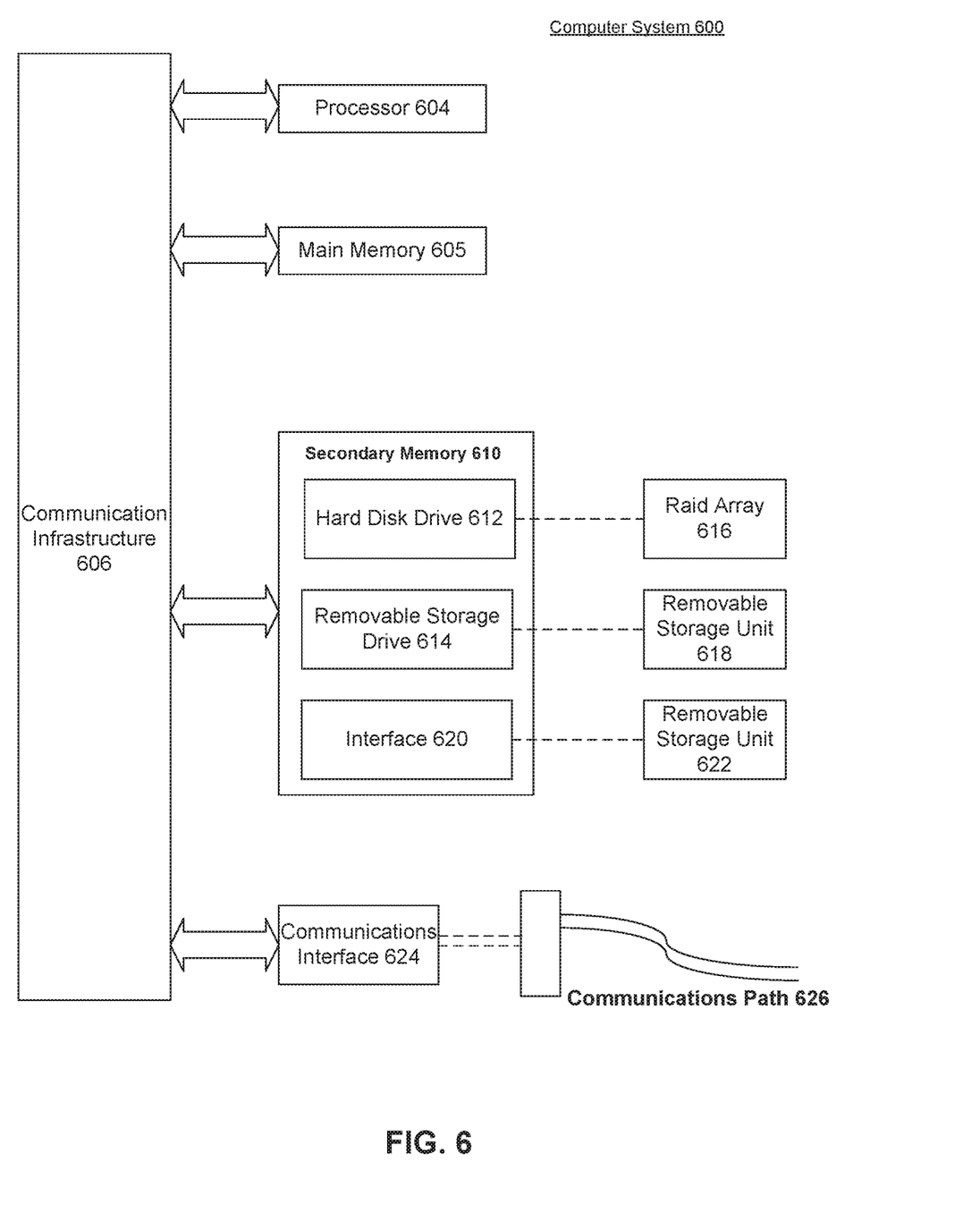
FIG. 6 is a block diagram of an exemplary computer system which can be used to implement the embodiments disclosed herein.

The following describes a general-purpose computer system that can be used to implement embodiments of the disclosure presented herein. The present disclosure can be implemented in hardware, or as a combination of software and hardware. Consequently, the disclosure may be implemented in the environment of a computer system or other processing system. An example of such a computer system 600 is shown in FIG. 6. The computer system 600 includes one or more processors, such as processor 604. Processor 604 can be a special purpose or a general-purpose digital signal processor. The processor 604 is connected to a communication infrastructure 606 (for example, a bus or network). Various software implementations are described in terms of this exemplary computer system. After reading this description, it will become apparent to a person skilled in the relevant art how to implement the disclosure using other computer systems and/or computer architectures.

Computer system 600 also includes a main memory 605, preferably random access memory (RAM), and may also include a secondary memory 610. The secondary memory 610 may include, for example, a hard disk drive 612, and/or a RAID array 616, and/or a removable storage drive 614, representing a floppy disk drive, a magnetic tape drive, an optical disk drive, etc. The removable storage drive 614 reads from and/or writes to a removable storage unit 618 in a well-known manner. Removable storage unit 618 represents a floppy disk, magnetic tape, optical disk, etc. As will be appreciated, the removable storage unit 618 includes a computer usable storage medium having stored therein computer software and/or data.

In alternative implementations, secondary memory 610 may include other similar means for allowing computer programs or other instructions to be loaded into computer system 600. Such means may include, for example, a removable storage unit 622 and an interface 620. Examples of such means may include a program cartridge and cartridge interface (such as that found in video game devices), a removable memory chip (such as an EPROM, or PROM) and associated socket, and other removable storage units 622 and interfaces 620 which allow software (i.e. instructions) and data to be transferred from the removable storage unit 622 to computer system 600.

Computer system 600 may also include a communications interface 624. Communications interface 624 allows software and data to be transferred between computer system 600 and external devices. Examples of communications interface 624 may include a modem, a network interface (such as an Ethernet card), a communications port, a PCM-CIA slot and card, etc, that are coupled to a communications path 626. The communications path 626 can be implemented using wire or cable, fiber optics, a phone line, a cellular phone link, an RF link and other communications links or channels.

The terms "computer program medium" and "computer usable medium" are used herein to generally refer to media such as removable storage drive 614, a hard disk installed in hard disk drive 612, or other hardware type memory. These computer program products are means for providing or storing software (e.g. instructions) to computer system 600.

Computer programs (also called computer control logic) are stored in main memory 605 and/or secondary memory 610. Computer programs may also be received via communications interface 624. Such computer programs, when executed, enable the computer system 600 to implement the present disclosure as discussed herein. In particular, the computer programs, when executed, enable the processor 604 to implement the processes and/or functions of the present disclosure. For example, when executed, the computer programs enable processor 604 to implement part of or all of the steps described above with reference to the flowcharts herein. Where the disclosure is implemented using software, the software may be stored in a computer program product and loaded into computer system 600 using raid array 616, removable storage drive 614, hard drive 612 or communications interface 624.

In other embodiments, features of the disclosure are implemented primarily in hardware using, for example, hardware components such as Application Specific Integrated Circuits (ASICs) and programmable or static gate arrays or other state machine logic. Implementation of a hardware state machine so as to perform the functions described herein will also be apparent to persons skilled in the relevant art(s).

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any hardware mechanism for storing information in a form readable by a machine (e.g., a computing device). For example, a machine-readable medium may include read only memory (ROM); random access memory (RAM); magnetic disk storage media; optical storage media; flash memory devices; and other hardware implementations. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

In embodiments having one or more components that include one or more processors, one or more of the processors can include (and/or be configured to access) one or more internal and/or external memories that store instructions and/or code that, when executed by the processor(s), cause the processor(s) to perform one or more functions and/or operations related to the operation of the corresponding component(s) as described herein and/or as would appreciated by those skilled in the relevant art(s).

It is to be appreciated that the Detailed Description section, and not Abstract section, is intended to be used to interpret the claims. The Abstract section may set forth one or more but not all exemplary embodiments of the present disclosure as contemplated by the inventors, and thus, is not intended to limit the present disclosure and the appended claims in any way.

The embodiments presented herein have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A power outage detection system for detecting a power outage in a geographic area, the power outage detection system comprising:
   a memory that stores one or more instructions; and
   a processor configured to execute the one or more instructions, the one or more instructions, when executed by the processor, configuring the processor to:
   determine one or more non-responsive cable modems from among a plurality of cable modems,
   correlate and aggregate locations of the one or more non-responsive cable modems to determine the geographic area having a percentage of the one or more non-responsive cable modems that is higher than a predetermined threshold,
   confirm whether the one or more non-responsive cable modems are non-responsive due to the power outage in the geographic area,
   generate a first report indicating the power outage in the geographic area when the percentage is above the predetermined threshold and the one or more non-responsive cable modems are non-responsive due to the power outage in the geographic area,
   poll the one or more non-responsive cable modems,
   detect whether the one or more non-responsive cable modems are responsive based upon the polling, and
   generate a second report indicating that power has been restored in the geographic area in response to detecting the one or more non-responsive cable modems as being responsive.

2. The power outage detection system of claim 1, wherein the one or more instructions, when executed by the processor, further configure the processor to determine the one or more non-responsive cable modems based upon polling data received from polling the plurality of cable modems.

3. The power outage detection system of claim 2, wherein the one or more instructions, when executed by the processor, configure the processor to correlate one or more phone calls logged in a database that report the power outage in the geographic area to the polling data to confirm whether the one or more non-responsive cable modems are non-responsive due to the power outage in the geographic area.

4. The power outage detection system of claim 1, wherein the one or more instructions, when executed by the processor, configure the processor to:
   receive data relating to a node coupled to the one or more non-responsive cable modems that the node is experiencing a power failure; and
   confirm the one or more non-responsive cable modems are non-responsive due to the power failure experienced by the node.

5. The power outage detection system of claim 1, wherein the one or more instructions, when executed by the processor, configure the processor to:
   receive data from a node coupled to the one or more non-responsive cable modems that indicate one or more fiber optic cables coupled to the node are experiencing a failure; and
   confirm the one or more non-responsive cable modems are non-responsive due to the failure experienced by the one or more fiber optic cables.

6. The power outage detection system of claim 1, wherein the one or more instructions, when executed by the processor, configure the processor to generate the first report based on a time of day when the percentage is above the predetermined threshold.

7. A method for detecting a power outage, the method comprising:
   polling, by a Cable Modem Termination System (CMTS), a plurality of cable modems;
   determining, by the CMTS, one or more non-responsive cable modems from among the plurality of cable modems based on the polling;
   correlating and aggregating, by the CMTS, locations of the one or more non-responsive cable modems to determine a geographic area having a percentage of the one or more non-responsive cable modems that is higher than a predetermined threshold;
   confirming, by the CMTS, whether the one or more non-responsive cable modems are non-responsive due to the power outage in the geographic area;
   generating, by the CMTS, a first report indicating the power outage in the geographic area when the percentage is above the predetermined threshold and the one or more non-responsive cable modems are non-responsive due to the power outage in the geographic area;
   polling, by the CMTS, the one or more non-responsive cable modems;
   detecting, by the CMTS, whether the one or more non-responsive cable modems are responsive based upon the polling; and
   generating, by the CMTS, a second report indicating that power has been restored in the geographic area in response to detecting the one or more non-responsive cable modems as being responsive.

8. The method of claim 7, wherein the confirming comprises:
   correlating one or more phone calls logged in a database that report the power outage in the geographic area to the polling data to confirm whether the one or more non-responsive cable modems are non-responsive due to the power outage in the geographic area.

9. The method of claim 7, the wherein the confirming comprises:
   receiving data relating to a node coupled to the one or more non-responsive cable modems that the node is experiencing a power failure; and
   confirming the one or more non-responsive cable modems are non-responsive due to the power failure experienced by the node.

10. The method of claim 7, wherein the confirming comprises:
    receiving data from a node coupled to the one or more non-responsive cable modems that indicate one or more fiber optic cables coupled to the node are experiencing a failure; and
    confirming the one or more non-responsive cable modems are non-responsive due to the failure experienced by the one or more fiber optic cables.

11. The method of claim 7, wherein the generating comprises:
    generating the first report based on a time of day when the percentage is above the predetermined threshold.

12. A power outage detection system for detecting a power outage in a geographic area, the power outage detection system comprising:
    a plurality of cable modems; and
    a Cable Modem Termination System (CMTS), coupled to the plurality of cable modems, configured to:

determine one or more non-responsive cable modems from among the plurality of cable modems, correlate and aggregate locations of the one or more non-responsive cable modems to determine the geographic area having a percentage of the one or more non-responsive cable modems that is higher than a predetermined threshold, confirm whether the one or more non-responsive cable modems are non-responsive due to the power outage in the geographic area, generate a first report indicating the power outage in the geographic area when the percentage is above the predetermined threshold and the one or more non-responsive cable modems are non-responsive due to the power outage in the geographic area, poll the one or more non-responsive cable modems;

detect whether the one or more non-responsive cable modems are responsive based upon the polling; and generate a second report indicating that power has been restored in the geographic area in response to detecting the one or more non-responsive cable modems as being responsive.

13. The power outage detection system of claim 12, wherein the CMTS is further configured to determine the one or more non-responsive cable modems based upon polling data received from polling the plurality of cable modems.

14. The power outage detection system of claim 13, wherein the CMTS is configured to correlate one or more phone calls logged in a database that report the power outage in the geographic area to the polling data to confirm whether the one or more non-responsive cable modems are non-responsive due to the power outage in the geographic area.

15. The power outage detection system of claim 12, wherein the CMTS is configured to:

receive data relating to a node coupled to the one or more non-responsive cable modems that the node is experiencing a power failure; and confirm the one or more non-responsive cable modems are non-responsive due to the power failure experienced by the node.

16. The power outage detection system of claim 12, wherein the CMTS is configured to:

receive data from a node coupled to the one or more non-responsive cable modems that indicate one or more fiber optic cables coupled to the node are experiencing a failure; and confirm the one or more non-responsive cable modems are non-responsive due to the failure experienced by the one or more fiber optic cables.

17. The power outage detection system of claim 12, wherein the CMTS is configured to generate the first report based on a time of day when the percentage is above the predetermined threshold.

18. The power outage detection system of claim 1, wherein the one or more instructions, when executed by the processor, further configure the processor to send the first report to a power company to indicate the power outage in the geographic area.

19. The method of claim 7, further comprising:

sending the first report to a power company to indicate the power outage in the geographic area.

20. The power outage detection system of claim 12, wherein the CMTS is further configured to send the first report to a power company to indicate the power outage in the geographic area.

* * * * *